United States Patent [19]

Nester

[11] 4,246,054
[45] Jan. 20, 1981

[54] POLYMER MEMBRANES FOR X-RAY MASKS

[75] Inventor: James F. Nester, Ridgefield, Conn.

[73] Assignee: The Perkin-Elmer Corporation, Norwalk, Conn.

[21] Appl. No.: 93,331

[22] Filed: Nov. 13, 1979

[51] Int. Cl.³ .......................... B29D 7/02; B29D 7/20
[52] U.S. Cl. .................................... 156/74; 156/247;
   156/631; 156/668; 264/259; 264/299; 264/334;
   264/340
[58] Field of Search ............... 156/233, 236, 631, 632,
   156/656, 668, 247, 74; 264/259, 299, 334, 340,
   349, 311; 250/492, 505, 492 A; 430/256, 329

[56] References Cited

U.S. PATENT DOCUMENTS

| | | | |
|---|---|---|---|
| 3,607,997 | 9/1971 | Linturn | 264/255 |
| 3,742,229 | 6/1973 | Smith et al. | 250/492 A |
| 3,892,973 | 7/1975 | Coquin et.al. | 250/492 A |
| 4,170,512 | 10/1979 | Flanders et al. | 250/492 R |

Primary Examiner—W. E. Hoag
Attorney, Agent, or Firm—Salvatore A. Giarratana; Francis L. Masselle; Edwin T. Grimes

[57] ABSTRACT

Polymer membranes are formed by spinning a monomer solution on a smooth surface of a plate and heat curing the solution to form a polymer film. A carrier element is attached to the film and together they are immersed in a suitable chemical composition to react with the bond between the film and plate. The assembly is then immersed in water to cause the plate to fall away from the film.

6 Claims, 4 Drawing Figures

POLYMER MEMBRANES FOR X-RAY MASKS

BACKGROUND OF THE INVENTION

This invention relates to a method of making a membrane which may be used in making a mask for use in lithography.

Different types of lithography are used in order to expose a photoresist which is deposited on the semiconductor wafer during the manufacture of integrated semiconductor circuits. Miniaturization and providing a large number of circuits on a chip requires the use of shorter wavelengths to obtain good resolution and small size. As a result, X-ray lithography involving short wavelengths which permit particularly fine features to be defined have been used.

Lithography, whether involving X-rays or other types of rays, generally utilizes a mask having a desired pattern thereon. The mask is interposed between a source of radiation and a semiconductor substrate coated with the resist on which a pattern is to be exposed. The mask must result in good definition of the lines being exposed, with the masked area being opaque to the radiation being used and the mask sustrate being transparent to that radiation.

The mask substrate which is transparent to radiation may be a thin film of the thermo-plastic polyester (polyethylene teraphthalate) or a thermoset polyimide sold under trademarks MYLAR and KAPTON, respectively. A typical material which may be used as the radiation absorber on the substrate may be gold.

Because of the relatively small size of the membrane used in making a mask for X-ray lithography, it is desirable to provide a carrier for handling the membrane until it is ready for additional tensioning and attachment by epoxy bonding to a mask support ring. It is important that the membrane is not damaged when it is removed from the substrate on which it is generally formed, which may happen if the substrate is dissolved by harsh chemical means.

OBJECTS OF THE INVENTION

It is an object of this invention to provide an improved method of forming a polymer membrane for use in lithography mask fabrication.

It is a further object of this invention to provide an improved method of forming a polymer membrane and handling it until it is ready to use in lithography mask fabrication.

BRIEF SUMMARY OF THE INVENTION

In accordance with the present invention, a polymer membrane is formed by spinning a suitable monomer solution on a highly polished surface of a solicon wafer or glass plate. The spun film is then thermally dried and cured in situ on the wafer or glass plate. A metal carrier ring is then attached to the membrane. The edges of the assembly including plate, membrane and ring are immersed in a suitable chemical solution to affect the bond between the membrane film and the wafer or plate. The assembly is the immersed in water to permit the wafer or plate to fall away from the membrane leaving it attached to the carrier ring.

Other objects and advantages of the present invention will be apparent and suggest themselves to those skilled in the art from a reading of the following specification and claims, taken in conjunction with the accompanying drawing.

DESCRIPTION OF INVENTION

In a method to be described relating to one embodiment of the present invention, free-standing polyimide membranes as large as 15 cm × 15 cm square with thicknesses ranging from 0.5 to 15 μm may be involved.

Figure 1:
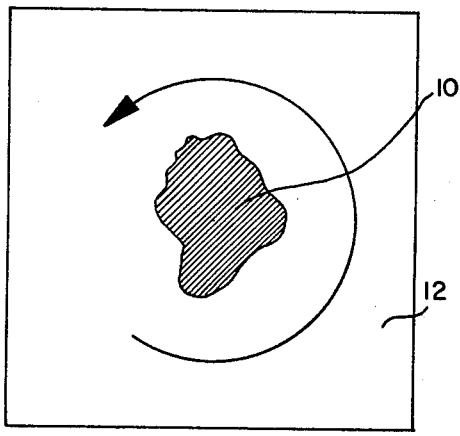
FIGS. 1-4 illustrate a series of steps for forming a membrane with a carrier, in accordance with the present invention.

Referring to FIG. 1, a solution of suitable composition 10 is placed on a member 12 which may, for example, comprise a silicon wafer or glass plate having a highly polished surface. The member 12 is then spun at a relatively high speed to cause the solution to spread over the surface of the member 12.

In one embodiment, to form a membrane thickness of 3.5 μm, a monomer solution consisting of 4 parts polyamic acid, 1 part N-methyl-2-pryollidone, and 1 part acetone spun at 2,300 rpm for 120 seconds produced satisfactory results. Upon completion of the spinning cycle, the spun film is thermally dried and cured in situ to polyimide on the silicon or glass substrate or member 12. As a result of the curing process, the membrane is slightly tensioned.

Figure 2:
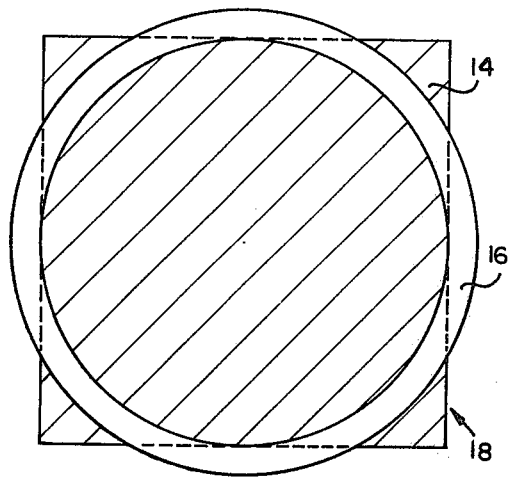
Figure 3:
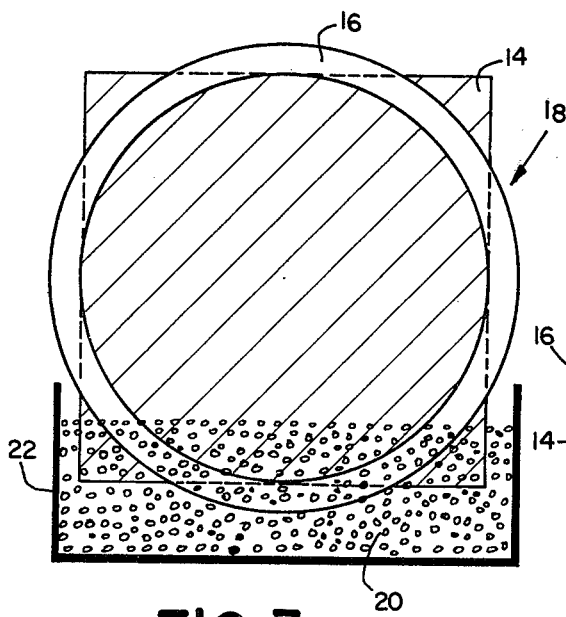

Following the formation of the film or membrane 14 on the member 12, a ring 16, which may be aluminum, is attached therto, as illustrated in FIG. 2. The aluminum ring may be attached to the membrane 14 by a double-sided tape or other suitable means to form an assembly 18 including the member 12, membrane 14 and ring 16. The ring 16 is designed to handle or carry the membrane 14 until it is ready for use in fabricating a mask for use in lithography.

The edges of the assembly 18 are then immersed for approximately 20 seconds per edge in concentrated hydrofluoric acid 20 within a container 22. The acid reacts with the bond between the member 12 and the membrane 14 and prepares the membrane 14 for subsequent removal from the substrate or member 12.

Figure 4:
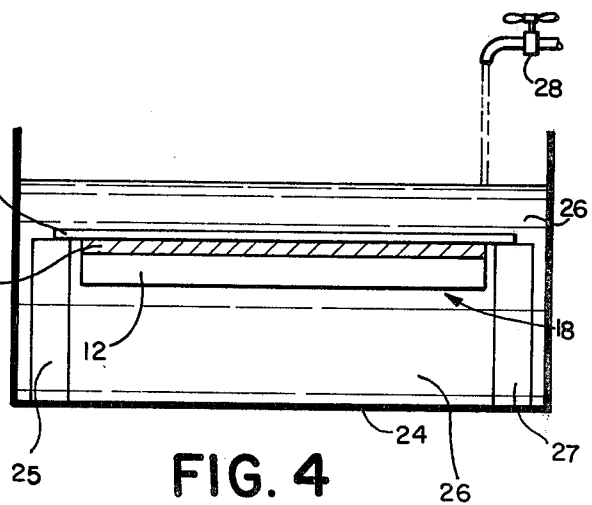

The outer edges of the membrane 14 are substantially separated from the member 12 thereby permitting water to be applied between the membrane 14 and member 12 while the weight of the membrane or substrate 14 acts to separate the two as illustrated in FIG. 4.

Following the immersion in the hydrofluoric acid solution, as illustrated in FIG. 4, the assembly 18 is placed on a pair of support members 25 and 27 within a container 24. The assembly 18 is placed so that the ring 16 rests on the supports 25 and 27 and the plate or substrate 12 is disposed in the lowermost position. Cold water 26 is poured from a source 28 into the container 24. The assembly 18 is immersed until the member or substrate 12 falls away from the member 14. The weight of the substrate 12, along with the fact that much of the bonding between the membrane 14 and the substrate 12 has been removed, facilitates the final separation of the parts.

After falling away, the member 14 is free of the substrate 12 but remains attached to the ring 18. The ring 18 now serves as a handler or carrier for the membrane 14 to facilitate subsequent handling for further tensioning and epoxy bonding to a mask support ring in preparation of a mask for use in X-ray lithography.

It is noted that the elements making up the assembly 18 are disposed horizontally on the support means. The plate or substrate 12 is the lowermost element in the assembly and free of the support elements 25 and 27. The weight of the substrate 12 therefore exerts a downward force away from the membrane 14. Evantually the separation is obtained without restoring to harsh chemicals which tend to mar the surface of the membrane and making it unusable in a lithographic mask.

What is claimed is:

1. A method of forming a free standing membrane for use in the fabrication of a lithography mask comprising the steps of:
   a. forming a plastic membrane on a substrate member;
   b. adhering a ring element to said membrane to provide an assembly;
   c. immersing edges of said assembly in a chemical solution to loosen a portion of the bonding between said membrane and said substrate member, and
   d. immersing said assembly in water to cause said substrate member to fall away from said plastic membrane secured to said ring element.

2. A method of forming a membrane as set forth in claim 1 wherein additional steps include providing support means for said assembly in said water and placing said assembly on said support means with said substrate member in the lowermost position free of said support means.

3. A method of forming a membrane as set forth in claim 2 wherein the step of forming a membrane includes heat curing a monomer solution on said substate member prior to adhering said ring element.

4. A method of forming a membrane as set forth in claim 3 wherein the step of forming a membrane further includes the step of placing a monomer solution on said substrate member and spinning said substrate member at about 2300 rpm for 120 seconds to spread said monomer solution thereon prior to said heat curing.

5. A method of forming a free standing membrane wherein an additional step includes providing a substrate member having a highly polished surface prior to placing a monomer solution thereon which comprises 4 parts polyamic acid, 1 part N-methyl-2-pyrollidone and 1 part acetone to produce a polyimide membrane.

6. A method as set forth in claim 5 wherein an additional step includes providing a container with hydrofluoric acid therein for the immersion of said assembly.

* * * * *

UNITED STATES PATENT AND TRADEMARK OFFICE
CERTIFICATE OF CORRECTION

PATENT NO. : 4,246,054
DATED : January 20, 1981
INVENTOR(S) : James F. Nester

It is certified that error appears in the above–identified patent and that said Letters Patent are hereby corrected as shown below:

Column 1, line 25, change sustrate to --substrate

Column 1, line 56, change solicon to --silicone

Column 1, line 63, change the to --then--

Column 3, line 6, change Evantually to --Eventually

Column 4, line 7, change substate to --substrate

Signed and Sealed this

Fourteenth Day of April 1981

[SEAL]

Attest:

RENE D. TEGTMEYER

*Attesting Officer*    *Acting Commissioner of Patents and Trademarks*